United States Patent [19]

Halloran et al.

[11] Patent Number: 6,117,612

[45] Date of Patent: Sep. 12, 2000

[54] STEREOLITHOGRAPHY RESIN FOR RAPID PROTOTYPING OF CERAMICS AND METALS

[75] Inventors: John W. Halloran; Michelle Griffith, both of Ann Arbor, Mich.; Tien-Min Chu, Taipei, Taiwan

[73] Assignee: Regents of the University of Michigan, Ann Arbor, Mich.

[21] Appl. No.: 08/947,269

[22] Filed: Oct. 8, 1997

Related U.S. Application Data

[63] Continuation of application No. 08/426,853, Apr. 24, 1995, abandoned.

[51] Int. Cl.[7] ................................ G03F 7/20; G03F 7/40
[52] U.S. Cl. ........................ 430/269; 430/269; 430/325; 430/330; 264/401; 264/430; 264/434
[58] Field of Search ................................ 430/283.1, 269, 430/325, 330; 264/401, 430, 434

[56] References Cited

U.S. PATENT DOCUMENTS

| | | | |
|---|---|---|---|
| 4,575,330 | 3/1986 | Hull | 425/174.4 |
| 4,828,961 | 5/1989 | Lau et al. | 430/198 |
| 4,894,194 | 1/1990 | Janney | 264/109 |
| 5,028,362 | 7/1991 | Janney et al. | 264/25 |
| 5,109,589 | 5/1992 | Cramer et al. | 29/527.4 |
| 5,145,908 | 9/1992 | Jenny et al. | 524/827 |
| 5,399,770 | 3/1995 | Leppard et al. | 568/15 |
| 5,496,682 | 3/1996 | Quadir et al. | 430/269 |

FOREIGN PATENT DOCUMENTS 6222202  3/1987  Japan.

OTHER PUBLICATIONS

"Selective Laser Sintering of Calcium Phosphate Powders", G. Lee and J.W. Barlow, Solid Freeform Fabrication Proceedings, ed. H.L.Marcus, et al, Sep. 1994, Proceedings of the SFF Symposium, Austin, Texas, Aug. 8–10, 1994, Univ. of Texas (pp. 181–190).

"Anisotrophy in Alumina Processed by SLS", P. Kamatchi Subramanian, et al., Solid Freeform Fabrication Proceedings, ed. H.L.Marcus, et al, Sep. 1994, Proceedings of the SFF Symposium Austin, Texas, Aug. 8–10, 1994, Univ. of Texas pp. 330–338.

"Solid Freeform Fabrication of Functional Ceramic Components, etc.", Curtis Griffin, et al, Solid Freeform Fabrication Proceedings, ed. H.L. Marcus, et al, Sep. 1994, Proceedings of the SFF Symposium, Austin, Texas, Aug.8–10, 1994, Univ.of TX pp. 17–24.

"Extrusion Methods for Solid Freeform Fabrication", P. Calvert, et al, Solid Freeform Fabrication Proceedings, ed. H.L.Marcus, et al, Sep. 1994, Proceedings of the SFF Symposium, Austin, Texas, Aug. 8–10, 1994, Univ.of TX pp. 50–55.

"Ultraviolet Curing of Highly Loaded Ceramic Suspensions for Stereolithography of Ceramics", Griffith and Halloran, pp. 96–403 in Solid Freeform et al, ed.by H.L.Marcus Proc.–SFF Symp.Austin, Aug. 8, 1994; M.L.Griffith, PhD Thesis, Univ.of Mich. Mar. 17, 1995.

"On Windowpanes and Christmas–Trees: Diag. Techniques for Improved Part Accuracy", H.Nyguen, et al, pp. 41–62, 3rd Int'l Conference on Rapid Prototyping, Jun. 7–10, 1992, Dayton, OH, A.J. Lightman and R.P. Chartoff, ed.

"Micro–Constructive Manufacturing by Three Dimensional Printing", E. Sachs, et al, Proceedings of the 1993 Design and Manufacturing Systems Conference, Society of Manufacturing Engineers, Dearborn, MI, pp. 1657–1666.

"Gelcasting—A New Ceramic Forming Process", Omatete, O.O., et al, Ceramic Bulletin vol. 70, No. 10, pp. 1641–1646, 1991.

"Gelacasting of Alumina", A.C. Young, et al, J.AM.Ceram.Soc., vol. 74, No. 3, pp. 612–618 (1991).

"Ultraviolet Curable Ceramic Suspensions for Stereolithography of Ceramics", M. L. Griffith and J. W. Halloran, Proceedings of the Symposium of Non–Traditional Design and Layered Manufacturing, Amer.Soc. of Mech.Engineers, Ann.Meeting, Nov. 1994.

"Evaluation of Ceramic Green Body Made By Photoforming", Xuechuan Shan, et al, Conference on Accurancy Engineering in MEMS '94, pp. 623–624.

"Manufacture of Stereo Micromachine Parts with Ceramics and Metal Powders", N. Nakajima and Univ. of Tokyo, Olympus Optical Co., Ltd., JETRO, Aug., 1994, p. 41.

"Computer Derived Microstructures of #D Printing: Bio– and Structural Materials", M.J. Cima, et al, Solid Freeform Fabrication Proceedings, Sep., 1994, Proc. of the SFF Symposium, Austin, Texas, Aug. 8–10, 1994, Univ. of Texas.

C.L.Haertling, et al, "Thick Film Patterned Ceramics Using UV–curable Pastes", J. American Ceramic Soc., vol. 73 [11], 3330–3344 (1990).

"Kinetic Optimization of UV Curable Aqueous Slurries for Applications in Ceramics Processing", Chu and Cochran, Proceedings of the 18th Ann.Conf.on Comp.and Advanced Ceramic Materials, vol. 15, No. 4, 1994.

"Proposed Method for Preparing Ceramic and Metal Micro Structures Using Photoforming" Xuechuan Shan, et al, Conference on Accuracy Engineering, in MEMS '94, pp. 579–580.

*Primary Examiner*—Cynthia Hamilton
*Attorney, Agent, or Firm*—Brooks & Kushman P. C.

[57] ABSTRACT

Photocurable ceramic resins having solids loadings in excess of 40 volume percent and a viscosity of less than 3000 mPa·s are suitable for multi-layer fabrication of green ceramic parts by stereolithography and similar techniques. The green ceramic parts, which may be of traditional ceramic materials, sinterable metals, or combinations thereof, exhibit low shrinkage upon firing or sintering, and may be used for such applications as rapid prototyping, biocompatible ceramic parts, ceramic cores for investment casting, ceramic molds for metal casting, and the like.

26 Claims, 3 Drawing Sheets

STEREOLITHOGRAPHY RESIN FOR RAPID PROTOTYPING OF CERAMICS AND METALS

This application is a continuation of application Ser. No. 08/426,853 filed Apr. 24, 1995, now abandoned.

This invention was made with government support by grant N00014-95-1-0527 awarded by the Office of Naval Research. The government has certain rights in the invention.

TECHNICAL FIELD

The present invention pertains to highly loaded photocurable resins suitable for use in rapid prototyping of green ceramic and green, sinterable metal structures by stereolithography. More particularly, the present invention pertains to low viscosity photocurable resin systems containing in excess of forty volume percent of ceramic or metal particulates.

BACKGROUND ART

Rapid prototyping or solid free-form fabrication has become an increasingly important manufacturing tool. In the past, three dimensional contoured articles have been prepared by cutting a suitable substrate material, i.e. paper or highly layered and resin impregnated plywood, into planar shapes having an edge contour matching that of the article to be fabricated along the particular plane, and stacking and laminating these shapes into an article with a contour approaching that of the final article. Such methods have been used, for example, to prepare model ship hulls and the body components for one of a kind "concept cars". The edges are smoothed to present the final product, the degree of smoothing necessary being dependent on the thickness of each layer. Such methods are labor-intensive and suitable only for relatively large parts.

In the mid-1980's, an automated process for preparing three dimensional articles termed "stereolithography", was developed, as evidenced by U.S. Pat. No. 4,575,330. In the stereolithographic process, hereinafter "SLA", a substrate is immersed in a photocurable resin to a predetermined, shallow depth, and scanned with a highly focused or collimated ultraviolet laser beam. The laser scan is computer controlled, with the scanning parameters derived from a CAD file corresponding to a section in plane of the proposed prototype shape. The photocurable resin polymerizes to a solid plastic material where struck by the laser beam, forming a single layer having a thickness in the range of 100–200 μm. The substrate is then lowered in the resin bath forming an additional polymerizable layer which is in turn scanned by the laser with a pattern corresponding to the new layer's shape as calculated from the CAD file. Prior to the second or subsequent laser scan, a wiping blade is often passed along the uppermost surface to ensure uniform resin layer depth. By repeating this process many times, a plastic article having the dimensions of the prototype part is produced.

The plastic parts produced by stereolithography may be the final part to be used in one of a kind production or small production runs, but is often the corresponding negative of such a part, which may then be used to prepare wax patterns for investment casting by the "lost wax" method. In the past, the complex molds required to prepare the wax patterns have necessitated expensive machining steps. Following preparation of the wax patterns, these are surrounded by a shell mold of foundry sand, ceramic, plaster, or the like. The mold is heated to allow the wax to melt and drain from the mold, and molten metal poured into the cavity. At times, the hot metal may be poured without removing the wax pattern, the hot metal melting the wax and displacing it from the mold. Use of SLA to prepare the mold for the wax pattern enables rapid and economic production of highly detailed investment castings.

Many investment cast articles, however, are hollow, and require casting the metal around a ceramic core. In conventional technology, the ceramic core is injection molded from a silica-based ceramic and fired. The ceramic core is inserted into the wax pattern and the metal is cast. The ceramic core is then removed by chemical leaching, leaving a hollow interior with the precise shape of the core. The core itself is often of a complex shape, for example the cooling passages in jet turbine blades, and the molds required to produce the green ceramic core are time consuming and expensive to machine. For these reasons, core design is often simplified from what is desirable from a technological standpoint, with compromises in product performance.

Ceramic cores have been prepared by molding highly loaded ceramic dispersions in a thermocurable resin, as disclosed in U.S. Pat. Nos. 4,894,194, 5,028,362, and 5,145,908. Such processes allow the use of less expensive composite, plastic, or silicone rubber molds while also providing a green ceramic body having suitable strength for handling prior to firing. However, a mold of suitable shape must still be provided, and the process does not lend itself to small production runs or single prototypes.

It would be desirable to be able to utilize SLA for the rapid prototyping or production of ceramic cores and other ceramic and sinterable metal parts. Heretofore, this has not been possible. The resins useful in SLA must have a relatively low viscosity, generally below 3000 mPa·s, to allow for recoating of the part for successive laser scanning. As explained below, for successful use of ceramics in SLA, the solids loading must be high, yet the resin must be stable with regard to sedimentation as well as presenting essentially Newtonian behavior, i.e., the resin must not be thixotropic, and must be able to flow even under low shear conditions. Such resins have not previously been available.

It would be further desirable to utilize SLA for the direct production of ceramic molds for metal casting. The requirements for ceramic SLA resins suitable for preparing ceramic casting molds are similar to the requirements for preparing ceramic cores by SLA, using instead refractory ceramic powders of composition and particle sizes known in the art of metal casting as being advantageous for the production of ceramic casting molds. Use of such processes, which may be denominated a "direct shell process" enables the production of more sophisticated structures in a ceramic mold, to control, for example, the heat flow in various parts of the mold, or the mechanical strength thereof.

Photocurable resins containing ceramic pigments have been used as ultraviolet curable coatings, for example, titanium dioxide pigmented UV-curable paints. However, the particle loading is far too low to produce a useable ceramic material. During or prior to the firing of the green ceramic body, the organic resin incorporated with the ceramic precursor particles must volatilize or decompose, a stage termed "burn-out". Resins which volatilize effectively without leaving substantial carboniferous residue but are present in substantial amounts provide porous ceramics which exhibit considerable shrinkage, often in a non-uniform fashion. Resins which produce large amounts of carboniferous substances prevent efficient sintering across grain boundaries in the ceramic, producing a ceramic part with insufficient strength. When ceramic parts are required with high dielectric constant, the carbon remaining may render the part electrically conductive. When sinterable metal particles are utilized, the carbon may dissolve into the particles or carburize their surface, markedly changing the physical properties of the finished, sintered part.

Modestly loaded, photocurable metal particle and ceramic particle pastes have been utilized to prepare microelectronic devices such as thin film capacitors, as disclosed in U.S. Pat. No. 4,828,961. However, even with particle loadings in the range of 20–43 volume percent, the resins are highly viscous pastes requiring doctor blade coating. Such pastes are not suitable for SLA, nor is their particulate loading, even at their paste-like viscosity, sufficient to prepare useful sinterable metal or ceramic parts which can be fired without exhibiting shrinkage and while maintaining acceptable physical properties.

SUMMARY OF THE INVENTION

The present invention pertains to photocurable SLA resins having metal or ceramic particle loadings suitable for the preparation of high quality ceramic and sintered metal parts, while having essentially Newtonian viscosity which is below about 3000 mPa·s. Such resins must be self-leveling and exhibit flow even at exceptionally low shear rates. The resins of the subject invention enable the rapid prototyping of ceramic and sinterable metal parts, molds, and cores of complex shape in the same manner as is currently used with plastic parts prepared by SLA.

DESCRIPTION OF THE PREFERRED EMBODIMENTS

Figure 1:
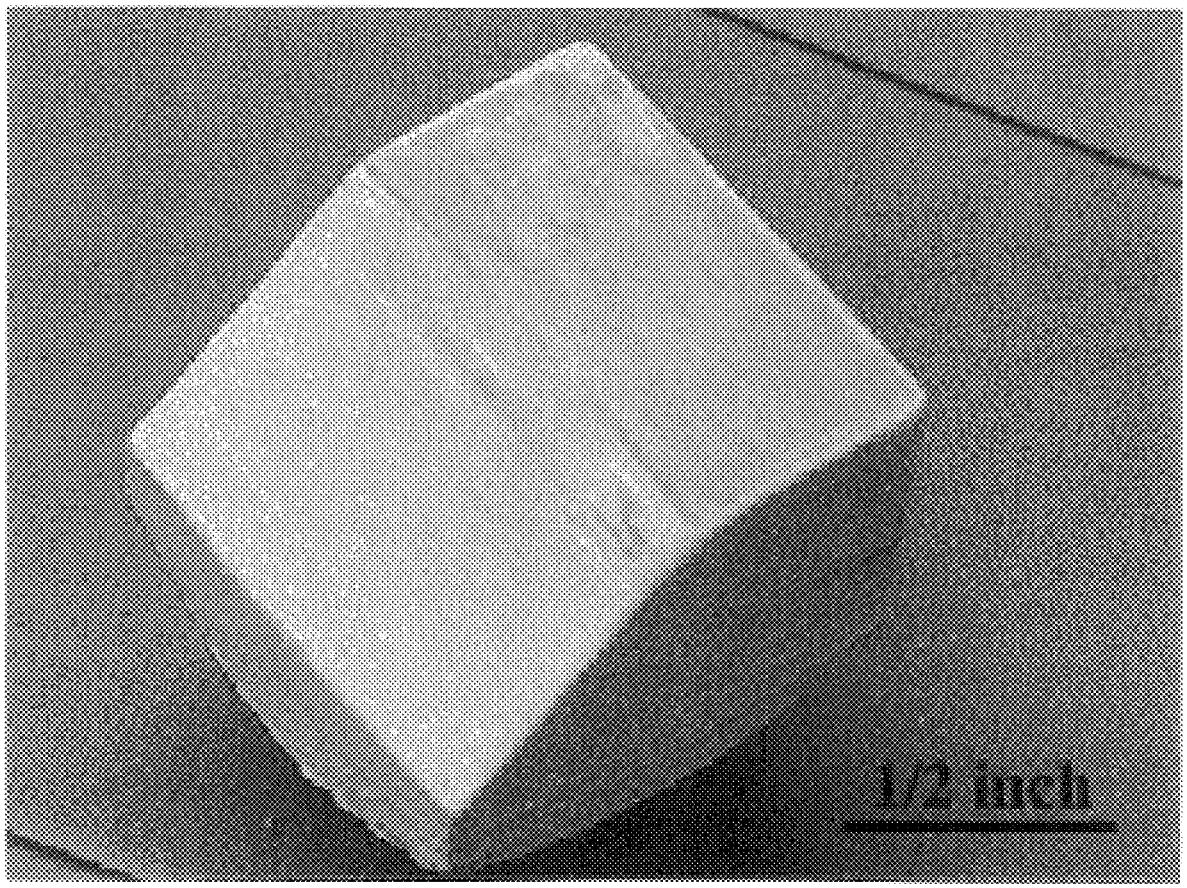
FIG. 1 is a photograph of a hollow green ceramic part made from a ceramic part made from a ceramic resin of the subject invention by SLA techniques.

For SLA of ceramics, it is essential that the depth of cure of the SLA resin be equal to or larger than the thickness of each layer. The layer thickness could be as small as 50 micrometers, but is preferably 200 micrometers or more. The depth of cure depends upon factors pertaining to the photopolymerization itself, including the monomer concentration, the nature and concentration of the photoinitiator, and the dose of actinic radiation, which can be measured by the energy density of the incident radiation, generally ultraviolet (UV) radiation. Factors related to the ceramic powder are also important. The depth of cure may be measured by placing a ceramic resin sample in a petri dish or tape casting onto a glass slide followed by exposure to UV light. The cured film may be lifted off the substrate and examined by optical or scanning electron microscopy to determine cure depth.

For UV transparent powders, the depth of cure is largely determined by scattering of the UV radiation. Provided the turbidity due to scattering is greater than the absorption due to the photoinitiator, the cure depth of a ceramic SLA resin is dependent upon the refractive indices of the ceramic powder and the medium, or $\Delta n = n_{ceramic} - n_o$. While not wishing to be constrained to any particular theory, this may be illustrated by the following relation between cure depth [$D_{cure}$], volume fraction powder [$\Phi$], incident energy density [$E_o$], and minimum energy density needed for curing [$E_{cure}$]

$$D_{cure} \propto \frac{1}{(\Delta n)^2} \ln\left[\frac{E_o}{E_{cure}}\right]$$

which has been found to describe cure depth in these SLA resins. See, M. L. Griffith and J. W. Halloran, "Ultraviolet Curing of Highly Loaded Ceramic Suspensions for Stereolithography of Ceramics", pp. 96–403 in SOLID FREEFORM FABRICATION PROCEEDINGS, edited by H. L. Marcus, J. J. Beaman, J. W. Barlow, D. L. Bourell, and R. H. Crawford, September 1994, Proceedings of the SFF Symposium held in Austin, Tex. on Aug. 8–10, 1994, University of Texas; M. L. Griffith, Ph.D. Thesis, University of Michigan, Mar. 17, 1995. The inverse relationship between cure depth and the reciprocal of ceramic volume fraction allows extrapolation between data at different ceramic loadings. The logarithmic relationship with incident energy density shows how the UV dose changes the cure depth, and so predicts the effect of beam intensity and writing speed. The relationship with the minimum cure energy density ($E_{cure}$) indicates how factors which effect $E_{cure}$ such as nature and concentration of monomer, nature and concentration of photoinitiator, inhibitors or accelerants, will change the cure depth. It also illustrates the very important role of $\Delta n$. Thus, for a given ceramic material, which has a particular refractive index $n_{ceramic}$, the depth of cure will be strongly dependent upon the refractive index of the medium, $n_o$. The latter can be adjusted with diluents. For example, ethylene glycol added to aqueous ceramic dispersions increases the $n_o$, which decreases $\Delta n$ and provides a larger depth of cure. For non-aqueous systems, benzyl butyl phthalate may serve the same role. Other agents known in the art could also be substituted for modifying the refractive index, provided that they do not interfere with the photocuring of the monomer or the stability of the dispersion. In principle, $\Delta n$ could be reduced to zero by "index matching", when $n_o = n_{ceramic}$, using appropriate high refractive index fluids. This could eliminate scattering, so the depth of cure would be limited only by photoinitiator absorption. Depth of cure in highly metal-loaded ceramic resins is not light-scattering limited, as one might expect. However, useable depth of cure can still be achieved.

For ceramic SLA, it is important to use a suspension with a ceramic solids loading above 40 volume percent, preferably in the range of 50–60 volume percent, to assure a ceramic green body of high green density. High green density is important for two reasons. For some applications, the ceramic must be sintered to densify the body, to remove as much of the porosity as possible. Ceramics which will be ultimately densified by sintering are known to sinter better with a high green density. There are other applications for which the ceramics will not be densified. Examples of these are refractory ceramics for investment casting shells and cores, which are typically fired to cure an inorganic binder or cement so as to improve the strength, without causing densification. Moreover, these refractory ceramics are often designed to have a particular density value. This density will be determined to a great extent by the solids loading of the SLA resin. Methods to manipulate the packing density by controlling the particle size distribution of the ceramic powders are well known in the ceramic art, and may be applied to ceramic SLA resins as well.

An important aspect of the present invention is the ability to provide adequate dispersion of the fine ceramic powders to achieve fluid SLA slips with appropriate rheological behavior even at high solids loading. For SLA, the rheological properties are important in the recoat step, both for immersion, leveling, and flow under the recoat blade, and during draining after a build is completed. Here the important features are, first, a low apparent viscosity at shear rates between 0 and 1000 $s^{-1}$, the maximum shear rate during recoat. The viscosity should be as low as possible, and preferably below 3000 mPa·s. Second, the resin should exhibit a negligibly small apparent yield stress to allow for leveling. The rheological behavior of the ceramic suspension depends upon several factors, including: the base rheology of the medium, which should preferably have a viscosity below 10 mPa·s and be substantially Newtonian; the volume fraction of dispersed powder; the particle size distribution of the powder; the average size and specific surface area of the powder; and factors which affect colloidal stability, as is known in the art of colloids. For colloidal stability, a key factor is the choice of one or more surface active agents used as dispersants.

The ceramic resins of the subject invention contain one or more ceramic (i.e., ceramic and/or metal) powders of suitable mean particle size; a low viscosity photocurable resin; a dispersant; and a photoinitiator. The ceramic resins may further contain anti-skinning agents and refractive index altering agents.

The resins of the subject invention may contain ceramic particles, metal particles, or mixtures of both metal and ceramic particles, and will be described hereinafter using the term "ceramic resins" or like terms as being inclusive of both ceramic loaded, metal loaded, and both metal and ceramic loaded, photo-curable resins. The ceramic, metal/ceramic, or metallic particles are termed "sinterable powders" in the claims. The ceramic loading of the resins of the subject invention should be minimally about 40 volume percent. Loadings below this amount produce green ceramics which have unacceptable levels of shrinkage upon cure. Loadings in the range of 45–80 volume percent are preferred, more preferably 50–75 volume percent, and most preferably 50–60 volume percent. The upper limit of ceramic loading is limited by the viscosity of the resin and by the depth of cure sought. If the viscosity of the resin is higher than about 3000 mPa·s, for example, then the previously formed surface may be damaged when SLA systems employing resin recoat blades are used.

The ceramic particles (metal and/or ceramic) which are used have median particle sizes suitable for sintering or firing into ceramic, metal-ceramic, or sintered metal parts. Suitable particle sizes are, for example from 0.05 $\mu$m to 10 $\mu$m, preferably 0.1 $\mu$m to 5 $\mu$m, and most preferably in the range of 0.2 $\mu$m to 3 $\mu$m. The particle sizes may be adjusted to these ranges prior to resin preparation, or may be reduced in size by methods well known in the art, for example sand milling, ball milling, etc. Suitable powdered ceramic materials are available commercially and may be further reduced in size in situ in the presence of other resin components by the above-mentioned techniques or their equivalents.

The photocurable liquid which constitutes the continuous phase of the ceramic resins comprises a low viscosity resin system wherein monomers and/or oligomers (hereinafter both, "monomers") having photo-reactive groups, preferably vinyl unsaturation, are present. In general, such monomers are acrylate or acrylate monomers, such as the lower acrylate esters, methacrylates, acrylamides, bisacrylamides, and the like. The monomers may be organic solvent-soluble or water soluble, and may be utilized neat or in solution. The viscosity of the photocurable liquid prior to incorporation of ceramic particles is suitably below 100 mPa·s, preferably below 10 mPa·s.

Aqueous solutions are particularly useful due to their low viscosity and greater freedom from volatile organic compound emissions (VOC). Examples are solutions containing acrylamide and/or methacrylamide and methylene bisacrylamide or other suitable water soluble monomers. The weight percentage of monomers relative to the weight of the resin system without ceramic is generally in the range of 5 weight percent to 50 weight percent, preferably from 15 to 40 weight percent, and most preferably about 30 weight percent. A 9:1 ratio of acrylamide to methylene bisacrylamide is particularly suitable, although other ratios are suitable as well. Ratios in the range of 20:1 to 1:1 are useful, for example.

Examples of photocurable monomers which may be used neat or dissolved in suitable organic solvents include the diacrylates and triacrylates, for example hexanediol diacrylate and trimethylolpropane triacrylate. Di- or tri-acrylates of low molecular weight glycol ethers and polyethers such as diethylene glycol, triethylene glycol, dipropylene glycol, neopentylglycoldipropoxylate, and the like, are also suitable. Preferred due to its low viscosity is hexanediol diacrylate (HDODA), and mixtures of HDODA with polyfunctional acrylates such as trimethylolpropane triacrylate. A variety of acrylate and epoxy-based photocurable monomers are commercially available. Suitable commercial photo polymerizable resin systems are the PHOTOMER™ resins available from Henkel, as described in the PHOTOMER product brochure F-290, dated January 1990, Henkel Corporation, Coatings and Inks Division, Ambler, Pa. Suitable solvents include N-methylpyrrolidone, dimethylsulfoxide, phthalate esters, low boiling hydrocarbons and aliphatic ethers, acetone, methylethylketone, and the like.

A photoinitiator must be used. Preferably, the photoinitiator is one responsive to energy corresponding to light in the ultraviolet (UV) region of the spectrum. The incipient energy is preferably supplied by means of a UV laser, however other sources of energy to which the photoinitiator can respond, for example, X-rays, electron beams, or visible light may be used as well. The amount of photoinitiator is that amount which will provide for cure of the photocurable monomers at the desired energy input. An increase in the amount of photoinitiator will increase the rate at which the uncured ceramic resin may be scanned, thus increasing production rate. However, as the photoinitiator absorbs light, increasing the amount of photoinitiator decreases the depth of cure for a given ceramic loading. The effective range of photoinitiator may easily be ascertained by routine experimentation. Amounts of from 0.1 weight percent to 5 weight percent, preferably from 0.2 weight percent to 2 weight percent are suitable, these amounts calculated on the basis of the total weight of the ceramic resin.

When water is used as a solvent, it is necessary to select photoinitiators which are water soluble at the desired concentration. Mixtures of two or more photoinitiators may be necessary to provide the desired rate of photopolymerization. For example, two preferred photoinitiators are phosphine oxide-based photoinitiators DAROCUR® 4265 and DAROCUR® 2959, available from the Ciba-Geigy Corporation. These may be used in conjunction at 0.4 weight percent and 0.7 weight percent, which represent approximately the limit of solubility in aqueous systems. Addition of co-solvents or diluents may increase the solubility of such photoinitiators. In non-aqueous systems, for example those based on glycol diacrylates, photoinitiator solubility is less of a problem.

A dispersant is a necessary part of the ceramic resins of the subject invention. Dispersants aid in stably dispersing the high volume ceramic particles as well as providing for low viscosity at high ceramic particle loadings. Non-limiting examples of suitable dispersants include polyacrylic dispersants, polyvinylpyrrolidone dispersants, polyoxyethylene glycol dispersants, and polyether dispersants based on oxyalkylated monols, for example nonylphenol oxyethylates. DARVAN® 821A, available from R. T. Vanderbilt, and PVP K-15, available from I.S.P. Technologies, are examples of polyvinylpyrrolidone dispersants, which may be added to aqueous ceramic dispersions in the form of 60 weight percent and 40 weight percent solutions, respectively. For diacrylate dispersions, TRITON® X-100, an ethoxylated nonylphenol, available from the Union Carbide Corporation, has been found satisfactory. Polyacrylic acid and polymethacrylic acid salts are also suitable for aqueous systems. DARVAN®C is an example of an ammonium polyacrylate salt which is suitable.

The amount of dispersant may vary between about 0.3 weight percent to about 10 weight percent expressed as dispersant solids relative to total ceramic resin weight, more preferably between about 0.5 weight percent and 5 weight percent on the same basis. The amount of dispersant is inversely proportional to particle size of the ceramic particles, and directly proportional to solids loading. These "direct" and "inverse" relationships are not exact mathematical relationships, and routine experimentation may be used to determine the minimum amount of dispersant necessary for a given ceramic material of given particle size range and distribution in a chosen solvent/monomer system. For example, with aqueous acrylamide/methylene bisacrylamide systems employing 2.4 $\mu$m silica, approximately 1.5 weight percent PVP dispersant has been found adequate to prepare a ceramic resin with 50 volume percent silica loading, while similarly concentrated dispersions of alumina with 0.2 $\mu$m and 0.7 $\mu$m particle sizes typically require 2–3 weight percent and 1–2 weight percent surfactant, respectively. For alumina with a mean particle size of 0.34 $\mu$m in HDODA, 4 weight percent of TRITON® X-100 has been found satisfactory.

In preparing the ceramic resins, it has been found that it is generally necessary to add the ceramic powder to the continuous phase in portions, in conjunction with dispersant, followed by thorough milling, for example ball milling. Ultrasonic energy may also aid thorough dispersion. The size of each portion of ceramic added and the extent of milling following its addition is dependent on particle size. For silica, for example, which is generally supplied in larger particle sizes, approximately 40 weight percent of the total silica solids may be added with approximately 25 weight percent of the final dispersant and mixed under high shear for 15 minutes or ball milled for two to three hours. A second portion of identical size along with the same amount of dispersant may then be added similarly. The remaining silica and a larger amount of surfactant is finally added, following which the slurry is ball milled for several hours to ensure complete homogeneity.

However, for ceramic (and metal) particles having mean particle sizes below 1.0 $\mu$m, the powder should be added in smaller increments with a greater amount of dispersant, and extensively ball milled. For example, to prepare a 50 volume percent resin containing alumina particles below about 1 $\mu$m, each portion should represent about 10 volume percent, and the dispersion should preferably be ball milled for approximately 5 hours after the addition of each portion up to 30 volume percent, and for 10 hours after each portion thereafter. Dispersant is added with each increment, the total surfactant generally being 50% to 100% higher than the amount required to stably disperse the larger particles. By using such methods, ceramic resins having viscosities in the range of only 120 mPa·s to 350 mPa·s for aqueous dispersions having ceramic loadings of 50 volume percent, well below the SLA upper viscosity limit of 3000 mPa·s, have been achieved.

It has been found, particularly in aqueous ceramic resins, that addition of anti-skinning agents is desirable. Such agents eliminate or reduce formation of skin on the surface of the resin bath in an SLA machine. Examples of such agents include the low molecular weight glycols and polyoxyalkylene glycols, for example ethylene glycol, diethylene glycol, propylene glycol, dipropylene glycol, and the like. Polyhydric aliphatic polyols such as glycerine and trimethylolpropane may also be suitable. For example, when water is used as the solvent, ethylene glycol may advantageously be present in an amount of up to 50 weight percent, more preferably 10 weight percent to 40 weight percent, and most preferably 20 to 30 weight percent, these weight percentages based on the weight of the aqueous solution without ceramic powder, photoinitiators, dispersants, etc.

It has further been discovered that the cure depth of the ceramic resin may be manipulated by adjustment of the index of refraction of the liquid component of the resin. For the greatest possible cure depth, the difference in the index of refraction of the ceramic powder and the medium, $\Delta n = n_{ceramic} - n_o$, wherein $n_o$ is the refractive index of the liquid, should be minimized. In aqueous systems, addition of higher refractive index water soluble liquids or solids can increase $n_o$. An example is the use of ethylene glycol or other water soluble glycols and glycol ethers, which thus provide both an anti-skinning effect as well as index of refraction alteration. With non-aqueous systems, soluble high refractive liquids or solids such as benzylbutylphthalate, methyl- and higher alkylnaphthalenes, methoxy- and higher alkoxynaphthalenes, and halonaphthalenes, such as bromonaphthalene are suitable. Alkyl and alkoxynaphthalenes generally contain alkyl and alkoxy groups with from 1 to 20 carbon atoms. Multiply substituted alkylnaphthalenes, alkoxynaphthalenes, and analogous aromatic hydrocarbons may be used as well. The Cargill Corporation offers a number of index matching fluids. With some ceramic materials, certain halogenated hydrocarbons should be avoided. One skilled in the art of ceramics is aware of which halogenated materials are useful with each particular ceramic.

Index matching liquids and solids should be used in the minimum quantity necessary, preferably, for example, from 5 weight percent to 30 weight percent relative to the weight of liquid and liquid-soluble continuous phase components. The actual amount should be determined with the desired cure depth in mind. It is frequently possible to provide suitable cure depth for many applications, for example conventional laser scanning SLA, without use of index-altering substances, or with as little as 2–10 weight percent. The higher the amount of non-ceramic material present, the more organic material must be removed from the green ceramic by burnout. Moreover, use of large amounts of index of refraction altering substance decreases monomer concentration, which may affect green strength.

EXAMPLE 1

Silica Ceramic in Aqueous Acrylamide Solution

An aqueous solution was prepared containing 30 weight percent monomers. A 9:1 ratio of acrylamide (Aldrich) and methylene bisacrylamide (Aldrich) was added to water in a jar containing alumina ball milling media. A small amount of a dispersant solution is mixed with the water to about 0.5 weight percent dry basis. An increment of silica powder (quartz, with a median particle size of 2.4 micrometer, Atlantic Equipment Engineering) was added to produce a 20 volume percent suspension, and mixed in a high shear mixer for 15 minutes, or alternatively ball milled for 2–3 hours. A further 20 volume percent silica and additional 0.5 weight percent dispersant was added and the mixing procedure repeated. The last 10 volume percent silica powder was added with 1 weight percent additional dispersant. The resulting slurry was ball milled for 2 hours and examined to see if it was homogenized. The resulting silica SLA suspension contained 50 volume percent silica ceramic solids suspended in a medium consisting of 30 weight percent acrylamide/methylene bisacrylamide solution. The refractive index of the suspension medium was 1.3824. The suspension was ball milled for a further 5 hours to ensure complete homogenization. Prior to use, the photoinitiation system was added, consisting of 0.7 weight percent, with respect to water, of commercial products DAROCUR® 2959 and 0.4 weight percent DAROCUR® 4265. This mixture was ball milled for 2–3 hours. The resulting SLA resin has a viscosity of 120 mPa·s as measured by Brookfield viscometer (model DV-II, spindle #52) at 3 rpm.

This 50 volume percent silica suspension was tape cast onto a glass slide for ultraviolet curing. Photopolymerization occurs when the ceramic suspension is exposed to UV radiation from a medium pressure mercury vapor lamp. For an exposure of 1497 mJ/cm$^2$, the depth of cure (photopolymerization depth) is 250 micrometer. For an exposure of 5168 mJ/cm$^2$, $D_c$=420 micrometer. The resulting cured layer is hard and rigid.

More silica can be added to this solution to increase the ceramic green body strength while still giving a good cure depth. At 55 volume percent silica, a cure depth of 300 micrometer can be achieved with an exposure 5168 mJ/cm$^2$. At 60 volume percent, $D_c$=220 micrometers. The method of mixing and amount of dispersant is not critical for these resins due to the large particle size of the silica powder in aqueous suspension. The concentration of monomers in the water can be increased, which will give a larger cure depth. For example, a 50 volume percent silica suspension with a 50:50 ratio of monomers versus water has a cure depth of 460 micrometers, instead of 250 micrometers for the 30:70 solution.

EXAMPLE 2
Silica Ceramic in Acrylamide-Water-Ethylene Glycol Solution

Ethylene glycol is a solvent for acrylamide and increases the refractive index of the solution, aids in prevention of a dried surface skin, and improves the flexibility of the cured green ceramic. In this example, instead of a UV-curable solution consisting of 30 weight percent monomers and 70 weight percent water, a new solution was mixed containing 40 weight percent monomers: 40 weight percent of 9:1 acrylamide and methylene bisacrylamide, and 60 weight percent solvent, where the solvent consisted of 30 weight percent ethylene glycol (Sigma) and 70 weight percent water. This medium had a refractive index of 1.4182. After mixing 50 volume percent silica in this solution by methods described in Example 1, viscometer measurements showed that at 3 rpm, the viscosity was 205 mPa·s. The depth of cure at 1497 mJ/cm$^2$ was 425 micrometers.

The suspension can be cured in a UV lamp apparatus as in Example 1, or can be used for stereolithography in an SLA machine. FIG. 1 is a photograph of a 136 layer part in the shape of a hollow polyhedron made in a 3D Systems SLA-250 machine fitted with an Arion laser emitting at 351 nm. Build parameters were $E_c$=80 mJ/cm$^2$ and $D_p$=150 micrometers.

EXAMPLE 3
Alumina in Aqueous Acrylamide Solution

For particle sizes below 1.0 micrometer, the ceramic powder should be added in smaller increments, 10 volume percent or so, and more dispersants are required. However, the steps shown in Example 1 still apply. The monomers, water, media, and dispersants were added first, then the increments of alumina powder (AKP grades, Sumitomo Chemical, Japan) and dispersants. Each increment was followed by ball milling for 5 hours or more for powder volume fractions below 30 volume percent, and 10 hours of ball milling for subsequent volume fractions.

For $d_{50}$=0.61 micrometers (AKP-15), a Brookfield viscosity of 142 mPa·s at 3 rpm, and $D_c$=300 micrometer at 1497 mJ/cm$^2$ were achieved. For $d_{50}$=0.46 micrometers (AKP-50), a viscosity of 443 mPa·s at 3 rpm, and $D_c$=400 micrometers for 1497 mJ/cm$^2$ were obtained.

EXAMPLE 4
Alumina Ceramic in Acrylamide-Water-Ethylene Glycol Solution

Following the procedure of Example 2, the same UV-curable solution was made (40 wt % monomers and 60 weight percent ethylene glycol and water solvent), and a 50 volume percent alumina suspension was prepared by the method described in Example 3. The alumina powder used had a median particle size of 0.34 micrometer (Reynolds, RCP 172 DBM grade). The viscosity of the suspension at 3 rpm was 340 mPa·s, and the depth of cure 450 micrometers at 1497 mJ/cm$^2$.

EXAMPLE 5
Alumina in Diacrylate Solution

Reynolds alumina (RCP 172 DBM, $d_{50}$=0.34) was added to a monomer for ultraviolet curing. The monomer is 1,6-hexanediol diacrylate (Photomer 4017, Henkel). This monomer has a low viscosity of 6 mPa·s at 3 rpm. Triton X-100 from Union Carbide was used as the dispersant. As with the aqueous examples, the liquid monomer, media, and first portion of dispersant were added first. The alumina was added in 10 volume percent increments, and ball milled for 5–10 hours between increments. Additional dispersant was added with each increment of powder, for a total amount of 4 wt % (dry basis). The photoinitiator was DAROCUR® 4265 at 2 weight percent relative to the total weight of ceramic resin.

At 45 volume percent, the depth of cure was 410 micrometers at 5168 mJ/cm$^2$. After cure, the material was heated in air to 600° C. at 1° C./min to burn out the polymers, and then heated at 15° C./min to 1550° C., with a one hour dwell to sinter the alumina. The resulting material had a linear shrinkage of 17%.

Figure 2:
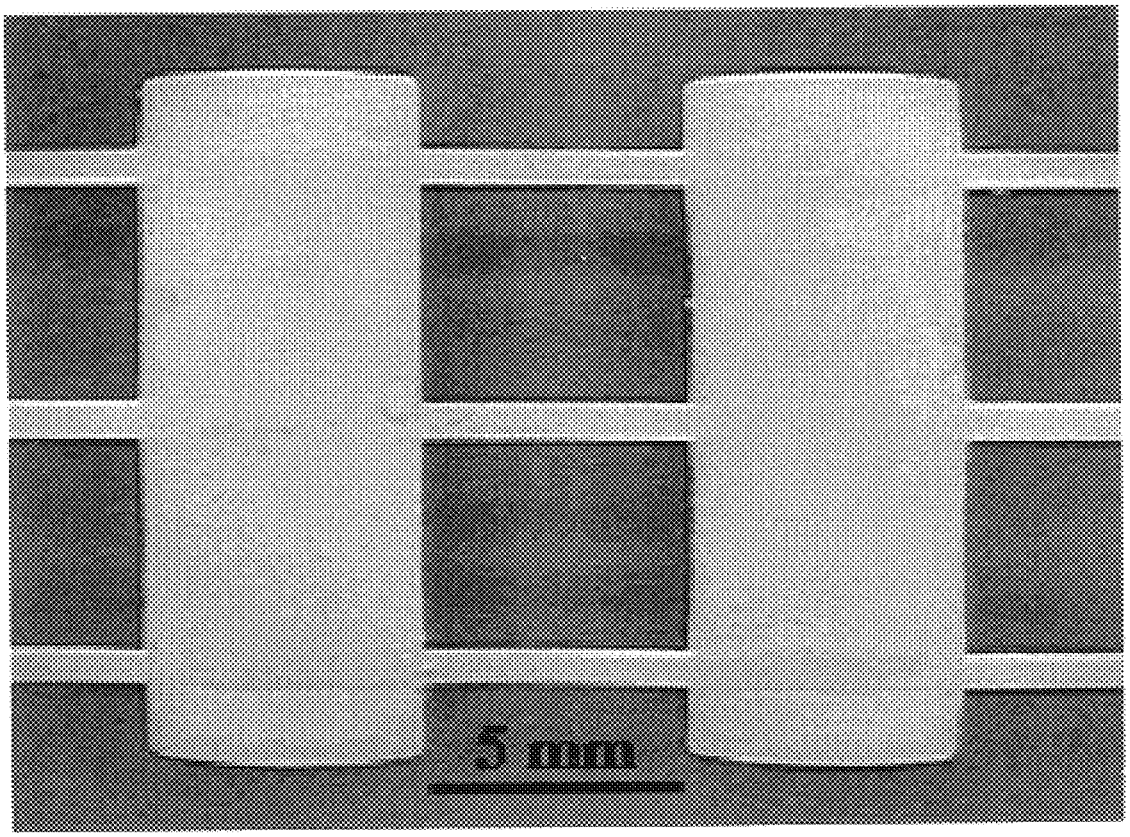
FIG. 2 is a photograph of an unfired, SLA-produced ceramic "window pane"
Figure 3:
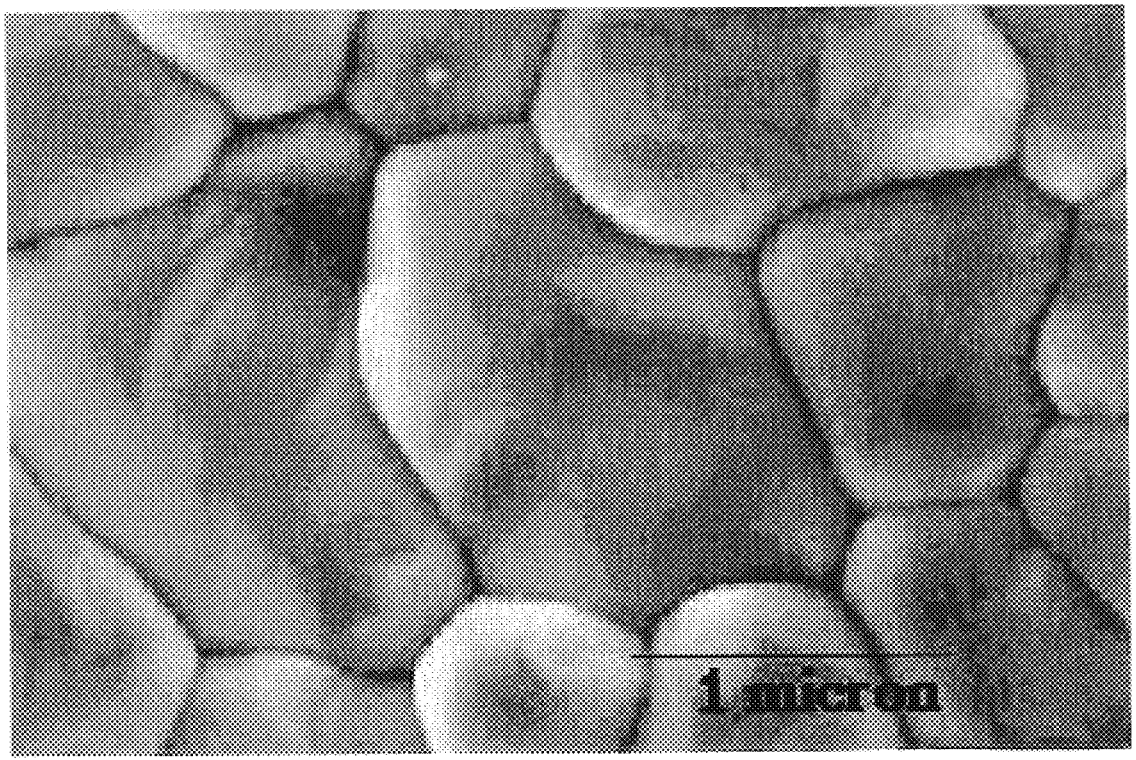
FIG. 3 is a Scanning Electron Micrograph of the fired aluminum oxide part of FIG. 2.

FIG. 2 is a photograph of an unfired aluminum oxide "window pane" pattern made from the ceramic SLA resin using an SLA-250 with Argon ion laser. FIG. 3 is a Scanning Electron Micrograph of the aluminum oxide after sintering at 1550° C. for one hour, showing excellent densification to a pore-free state.

EXAMPLE 6
Alumina in Diacrylate-Diluent Solution

Alumina (RCP 172 DBM, Reynolds Aluminum Co.) was dispersed in a UV curable mixture consisting of 40 volume percent Photomer 4017, 30 volume percent benzylbutylphthalate (Santicizer 160, Monsanto), and 30 volume percent dibasic esters (DBE, Dupont). The solids loading was 40 volume percent. This mixture was prepared as described in Example 5 with dispersant Triton X-100 in a total of 6 weight percent, dry basis. The depth of cure at 5168 mJ/cm² was 570 micrometers.

After cure, the material was heated in air to 600° C. at 1° C./min to burn out the polymers, and then heated at 15° C./min to 1550° C., with a one hour dwell to sinter the alumina. The resulting material had a linear shrinkage of 25%, larger than in Example 5 due to the lower solids loading.

EXAMPLE 7
Hydroxyapatite in Acrylamide Solution

A suspension of 30 volume percent hydroxyapatite powder and 70 volume percent water was prepared. Anionic dispersant was added to the suspension at a concentration of 6 weight percent on dry basis. This suspension was then ball-milled with alumina ball milling media for 30 hours to reach a $d_{50}$=0.35 micrometer. After milling, the suspension was dried in a drying oven at 85° C. for at least 24 hours. The dry cake was ground to powder. An aqueous solution was prepared comprising of 41 weight percent water, 36.9 weight percent acrylamide, and 4.1 weight percent methylene bisacrylamide and 18 weight percent of anionic dispersant. An increment of ground hydroxyapatite powder was added to produce a 30 volume percent suspension. The suspension was ball-milled for 15 minutes. A further 5 volume percent hydroxyapatite was added to the suspension and the slurry was ball-milled for 15 minutes. The step was repeated to reach a suspension containing 40 volume percent hydroxyapatite powder. A further 5 volume percent was added in increments of 1 volume percent. The slurry was ball-milled for 10 minutes each time after the powder was added. The hydroxyapatite SLA suspension now contains 45 volume percent hydroxyapatite powder suspended in a medium consisting of 41 weight percent acrylamide/methylene bisacrylamide. The suspension was ball-milled for 5–10 hours until fully homogenized. Prior to use, the photoinitiators were added with the same ratio described in Example 1. The resulting hydroxyapatite SLA suspension had a Brookfield viscosity of 2950 cp measured at 60 rpm and a $D_c$=280 micrometer when cured at a radiation dose of 376 mJ/cm².

EXAMPLE 8
Stainless Steel in Acrylate Solution

A suspension of 50 volume percent stainless steel metal powder was prepared in HDODA by mixing the steel powder (type 17-4PH, composition 16 parts Cr, 4.25 parts Ni, 3.8 parts Cu, balance Fe, 13 micrometer median particle size, from Ametek Specialty Metal Products Division, Eighty-Four, Pa) in 1,6-hexanediol diacrylate (Photomer 4017, Henkel). The photoinitiator was 2 weight percent DAROCUR® 4265. The depth of cure was 55 micrometers at a dose of 5100 mJ/cm².

Having now fully described the invention, it will be apparent to one of ordinary skill in the art that many changes and modifications can be made thereto without departing from the spirit or scope of the invention as set forth herein.

What is claimed is:

1. A process for the preparation of a multi-layer ceramic green body, comprising:
    a) selecting an aqueous photopolymerizable ceramic resin comprising:
        i) from 40 to about 80 volume percent of one or more sinterable powders;
        ii) one or more photopolymerizable monomer(s);
        iii) an effective amount of a photoinitiator; and
        iv) a dispersant;

wherein said photopolymerizable ceramic resin has a viscosity at 25° C. of less than 3000 mPa·s;
    b) coating a substrate with a first layer of said photopolymerizable ceramic resin;
    c) irradiating at least a portion of said layer with an energy source effective to activate said photoinitiator and induce photopolymerization of said layer to form a polymerized ceramic layer;
    d) coating said polymerized ceramic layer with a further layer of photopolymerizable ceramic resin;
    e) irradiating said further layer with an energy source effective to activate said photoinitiator and induce photopolymerization of said further layer to form a further polymerized ceramic layer;
    f) repeating steps d) and e) until a green ceramic body of a desired size and shape has been obtained.

2. The process of claim 1 wherein said irradiating comprises scanning the surface of a layer of photopolymerizable ceramic resin with a laser beam, the position of said laser beam being controlled by signals generated by a computer.

3. The process of claim 2 wherein said computer-generated signals are derived from a CAD program wherein said portion of said layer which is scanned corresponds to the dimensions of a plane section of a three-dimensional object having the dimensions of a ceramic green body whose preparation is desired.

4. The process of claim 1 wherein a stereolithography device is utilized to perform steps b) through f).

5. A ceramic green body prepared by the process of claim 4.

6. The process of claim 1 wherein said aqueous photopolymerizable resin comprises one or more water-soluble photopolymerizable monomers.

7. The process of claim 6 wherein at least one of said water-soluble photopolymerizable monomers comprise acrylamide, methacrylamide, methylene bisacrylamide, or mixtures thereof.

8. The process of claim 6 wherein said photoinitiators are phosphine oxide photoinitiators present in amounts such that said photoinitiators are soluble in said ceramic resin at room temperature.

9. A ceramic green body prepared by the process of claim 6.

10. The process of claim 1 wherein said photopolymerizable liquid comprises one or more photopolymerizable acrylate monomers.

11. The process of claim 10 wherein one of said one or more acrylate monomers are selected from the group consisting of hexanediol diacrylate, neopentyl glycol dipropoxylate diacrylate, and trimethylolpropane triacrylate.

12. A ceramic green body prepared by the process of claim 10.

13. The process of claim 1 wherein said photopolymerizable ceramic resin further comprises an index of refraction altering substance soluble in said liquid.

14. The process of claim 13 wherein said index of refraction altering substance is present in an amount of from about 5 weight percent to about 30 weight percent based on the weight of said liquid containing said index of refraction altering substance.

15. The process of claim 13 wherein said liquid comprises water and one or more water soluble monomers, and said index of refraction altering substance comprises one or more glycols, glycol ethers, polyhydric aliphatic polyols, or mixtures thereof.

16. A ceramic green body prepared by the process of claim 13.

17. A ceramic green body prepared by the process of claim 1.

18. The process of claim 1 wherein said photopolymerizable resin comprises water and one or more photopolymerizable monomers, said monomer(s) present in an amount of from about 5 weight percent to about 50 weight percent relative to the sum of the weights of water and monomer(s).

19. The process of claim 1 wherein said photopolymerizable resin comprises water and one or more photopolymerizable monomers, said monomer(s) present in an amount of from about 15 weight percent to about 40 weight percent relative to the sum of the weights of water and monomer(s).

20. The process of claim 1 wherein said monomer(s) comprise acrylamide and methylenebisacrylamide in an acrylamide/methylenebisacrylamide ratio of 20:1 to 1:1.

21. A process for the preparation of a multi-layer ceramic green body, comprising:
 a) selecting a photopolymerizable ceramic resin comprising:
   i) from 40 to about 80 volume percent of one or more sinterable powders;
   ii) a photopolymerizable liquid;
   iii) an effective amount of a photoinitiator; and
   iv) a dispersant;
 wherein said photopolymerizable ceramic resin has a viscosity of 25° C. of less than 3000 mPa·s;
 b) coating a substrate with a first layer of said photopolymerizable ceramic resin;
 c) irradiating at least a portion of said layer with an energy source effective to activate said photoinitiator and induce photopolymerization of said layer to form a polymerized ceramic layer;
 d) coating said polymerized ceramic layer with a further layer of photopolymerizable ceramic resin;
 e) irradiating said further layer with an energy source effective to activate said photoinitiator and induce photopolymerization of said further layer to form a further polymerized ceramic layer;
 f) repeating steps d) and e) until a green ceramic body of a desired size and shape has been obtained;
wherein said photopolymerizable ceramic resin further comprises an index of refraction altering substance.

22. A process for the preparation of a multi-layer ceramic green body, comprising:
 a) selecting an aqueous photopolymerizable ceramic resin having a continuous aqueous phase and a dispersed sinterable powder phase, comprising:
   i) from 40 to about 80 volume percent of one or more sinterable powders;
   ii) one or more photopolymerizable monomers;
   iii) an effective amount of a photoinitiator; and
   iv) a dispersant;
 wherein said photopolymerizable ceramic resin has a viscosity at 25° C. of less than 3000 mPa·s;
 b) coating a substrate with a first layer of said photopolymerizable ceramic resin;
 c) irradiating at least a portion of said layer with an energy source effective to activate said photoinitiator and induce photopolymerization of said layer to form a polymerized ceramic layer;
 d) coating said polymerized ceramic layer with a further layer of photopolymerizable ceramic resin;
 e) irradiating said further layer with an energy source effective to activate said photoinitiator and induce photopolymerization of said further layer to form a further polymerized ceramic layer;
 f) repeating steps d) and e) until a green ceramic body of a desired size and shape has been obtained;
wherein said photopolymerizable ceramic resin further comprises an index of refraction altering substance soluble in the continuous aqueous phase of said aqueous photopolymerizable ceramic resin, said index of refraction altering substance present in an amount of from about 5 weight percent to about 30 weight percent based on the weight of said continuous aqueous phase containing said index of refraction altering substance, wherein said index of refraction altering substance comprises ethylene glycol.

23. A process for the preparation of a multi-layer ceramic green body, comprising:
 a) selecting an aqueous photopolymerizable ceramic resin comprising:
   i) from 40 to about 80 volume percent of one or more sinterable powders;
   ii) one or more photopolymerizable monomers;
   iii) an effective amount of a photoinitiator; and
   iv) a dispersant;
 wherein said photopolymerizable ceramic resin has a viscosity at 25° C. of less than 3000 mPa·s;
 b) coating a substrate with a first layer of said photopolymerizable ceramic resin;
 c) irradiating at least a portion of said layer with an energy source effective to activate said photoinitiator and induce photopolymerization of said layer to form a polymerized ceramic layer;
 d) coating said polymerized ceramic layer with a further layer of photopolymerizable ceramic resin;
 e) irradiating said further layer with an energy source effective to activate said photoinitiator and induce photopolymerization of said further layer to form a further polymerized ceramic layer;
 f) repeating steps d) and e) until a green ceramic body of a desired size and shape has been obtained; and
wherein said photopolymerizable ceramic resin further comprises an effective amount of an anti-skinning agent.

24. The process of claim 23 wherein said anti-skinning agent comprises a glycol, glycol ether, polyhydric aliphatic polyol, or mixture thereof.

25. The process of claim 24 wherein said anti-skinning agent comprises ethylene glycol.

26. A ceramic green body prepared by the process of claim 23.

* * * * *